United States Patent [19]

Braun

[11] 4,338,621
[45] Jul. 6, 1982

[54] HERMETIC INTEGRATED CIRCUIT PACKAGE FOR HIGH DENSITY HIGH POWER APPLICATIONS

[75] Inventor: Robert E. Braun, Norristown, Pa.
[73] Assignee: Burroughs Corporation, Detroit, Mich.
[21] Appl. No.: 118,496
[22] Filed: Feb. 4, 1980
[51] Int. Cl.³ .................... H01L 23/02; H01L 23/12; H01L 39/02
[52] U.S. Cl. ........................ 357/74; 357/80; 357/81; 174/52 FP
[58] Field of Search ................. 357/70, 74, 80, 81; 174/52 FP

[56] References Cited

U.S. PATENT DOCUMENTS

| | | | |
|---|---|---|---|
| 3,495,023 | 2/1970 | Hessinger et al. | 357/81 |
| 3,502,786 | 3/1970 | Stoll | 357/81 |
| 3,504,096 | 3/1970 | Nagel | 357/81 |
| 3,872,583 | 3/1975 | Beall et al. | 357/81 |
| 4,004,195 | 1/1977 | Harayda et al. | 357/81 |
| 4,195,193 | 3/1980 | Grabbe et al. | 357/70 |
| 4,285,002 | 8/1981 | Campbell | 357/81 |

FOREIGN PATENT DOCUMENTS 54-128277  10/1979  Japan ............................ 357/80

*Primary Examiner*—Andrew J. James
*Attorney, Agent, or Firm*—K. R. Peterson; E. M. Chung; F. A. Varallo

[57] ABSTRACT

The present disclosure describes an hermetically sealed integrated circuit package capable of accommodating high density circuit configurations with their attendant high power levels. In performing this function, the package permits the back-bonded integrated circuit chip or die to be mounted to a thermally conductive member of the package which is disposed in an open air stream. Moreover, the opposite side of the package positioned in proximity to the interconnection medium remains available to be fully populated by a large number of closely spaced input/output pins.

8 Claims, 4 Drawing Figures

HERMETIC INTEGRATED CIRCUIT PACKAGE FOR HIGH DENSITY HIGH POWER APPLICATIONS

CROSS REFERENCE TO RELATED APPLICATION

To the extent that copending application Ser. No. 119,396 for "Hybrid Integrated Circuit-Pin Grid Package for High Power Aplications" by Robert E. Braun teaches a non-hermetic package construction useful in high density, high power applications, it is related to the hermetic package described and claimed herein for similar applications. Both the above identified application and the present one are assigned to a common assignee.

BACKGROUND OF THE INVENTION

The electronics industry has long recognized the need for a package to house an integrated circuit chip with a relatively large number of input and output leads or pins, for example, from 48 to 120 pins. A number of approaches to this problem have been attempted. For example, the conventional dual inline package (DIP) has been expanded to accommodate up to 64 leads. However, because of the large package size, its use with high speed circuits introduces unwanted signal delays and added capacitance. Additionally, the large DIP package exhibits poor thermal characteristics.

Other packages currently used in the industry for high density circuit configurations place the input/output pins on the bottom surface thereof. In such packages, the integrated circuit chip is mounted in proximity to the last mentioned surface such that the heat generated in the package must ordinarily be dissipated through the pins. From a thermal standpoint, this arrangement is highly inefficient. Moreover, in at least one such design, the permissible number of input/output pins is sacrificed to provide a chip mounting area.

Considerable effort is presently being expended in complicated and often cumbersome techniques for providing a low thermal resistance path between the integrated circuit chip mounted generally in proximity to the pin-carrying substrate and a cooling medium. The following articles appearing in the IBM Technical Disclosure Bulletin are representative of such effort: Vol. 22, No. 4, September 1979, "Module Package with Heat Sink Between Substrate and Circuit Board", by H. D. Stackhouse in which heat dissipation is through the input/output pins and the heat sink; Vol. 22, No. 1, June 1979, "Air and Liquid Drop Cooled Module", by J. R. Lynch where a heat conductive fluid is interposed between the chip and the package cap; Vol. 22, No. 1, June 1979, "Module Heat Pipe Cooling Structure"0 by B. V. Gokhale, et al., where a thermal path is provided by pipe wicks which are placed in contact with the chips; Vol. 21, No. 8, January 1979, "Self-Regulating Evaporative/Conductive Thermal Link" By K. P. Moran and R. E. Simons, in which a sealed flexible spring-like bellows and an internal wetted wick provide an improved thermal path from the chip to the primary coolant; Vol. 21, No. 8, January 1979, "Thermal Conductive Piston for Semiconductor Packages" by L. Landstein, which includes a spring-loaded slidable piston in contact with the chip to minimize thermal resistance.

The integrated circuit package described hereinafter obviates the problems inherent in present day packaging and provides in effect, both a high density of input/output connections and the thermal efficiency to dissipate the increased power associated therewith.

SUMMARY OF THE INVENTION

In accordance with the present invention, an hermetic integrated circuit package is provided in which the integrated circuit chip or die is bonded to a thermally conductive ceramic member facing an open air stream so that heat can be removed directly. Optionally, cooling fins may be attached to the last mentioned member to enhance heat dissipation. The other side of the package is fully populated with input/output pins.

More specifically, the integrated circuit chip or die is mounted on an interior recessed planar surface of a multilayer ceramic base member, and is wire bonded to electrically conductive tabs disposed on a ledge situated in proximity to the periphery of the die. These tabs are connected by embedded metallized lines and vias to associated pads on the planar surface of the base member, which surface contacts the interior surface of the ceramic lid or cover member in the completed assembly. The latter member includes electrically conductive pads homologously arranged with respect to the pads in the base member. The pads of the cover member are connected by metallized lines to vias and corresponding bosses on the exterior surface of the member to which the respective input/output pins are affixed. Hermeticity is achieved by brazing the input/output pins to the last mentioned bosses, and by sealing the base and cover members to each other during a solder reflow process utilizing a solder ring disposed along their respective mating peripheries. Moreover, signal paths are established between the die and the pins by connecting the corresponding pads of the respective members to each other during the reflow process.

The integrated circuit package of the present invention alleviates the problems that exist with other available technologies. For example, it provides excellent thermal performance per se, which may be further enhanced through the use of cooling fins. The package may be constructed in various sizes and pin counts, and in fact, will accommodate a large integrated circuit chip without sacrificing the number of input/output pins which may be utilized. A high density of pins may be incorporated which are compatible with standard 100 mil center hole patterns in printed circuit boards for direct solder attachment. If desired, the present package may be plugged into commerically available connectors or sockets. Another important physical characteristic of the package is its low profile, making it especially useful where the packages are to be mounted on parallel oriented, closely spaced-apart printed circuit boards.

Other features and advantages of the integrated circuit package of the present invention will become apparent in the detailed description which appears hereinafter.

DESCRIPTION OF THE PREFERRED EMBODIMENT

Figure 1:
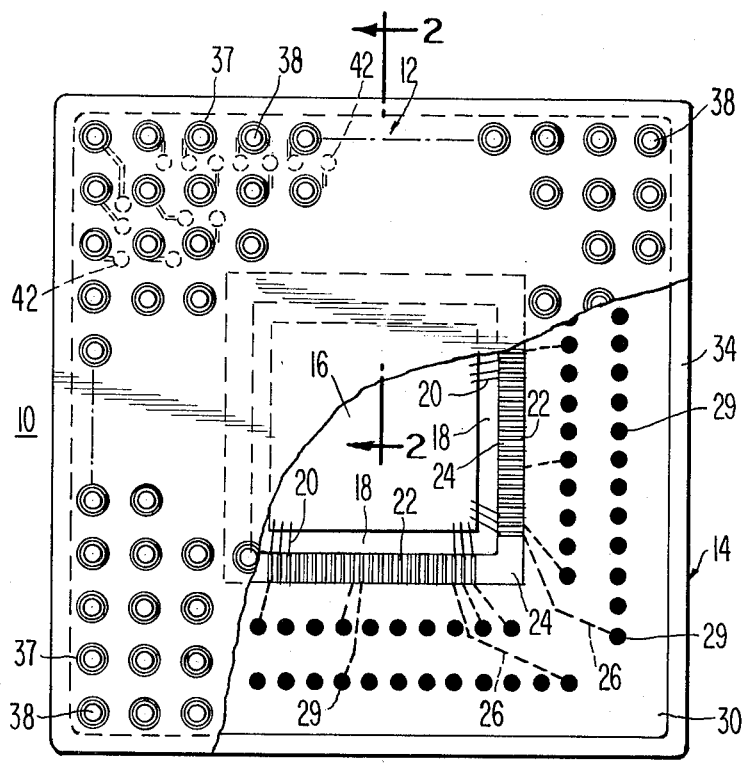
FIG. 1 is a bottom view of the integrated circuit package of the present invention depicted with a portion of the pin-carrying cover member cut away.

In FIG. 1, which depicts the bottom view of the integrated circuit package 10 of the present invention, a portion of the pin-carrying cover member 12 has been cut away to better illustrate the interior surface of the base member 14. With reference to FIG. 1 and the section view of FIG. 2 derived therefrom, an integrated circuit chip or die 16 is bonded to the planar surface within a recess 18 in the base member 14. The package 10 is of multilayer ceramic construction produced by well known ceramic processes. The die 16 includes a plurality of wires 20 extending outward from its periphery. These wires 20 are bonded respectively to electrically conductive tabs 22 disposed on a ledge 24 of the base member 14 which lies in proximity to the die 16. Electrical signals are carried from the tabs 22 in base member 14 by way of metallized lines 26 which are embedded in the ceramic material and by metallized vias 28 to corresponding pads 29 on the planar surface 30. It is the latter surface which contacts the interior surface 32 of the ceramic lid or cover member 12 in the completed package assembly. A metallized seal ring 34 is also provided around the mating peripheries of both the cover member 12 and the base member 14.

Figure 2:
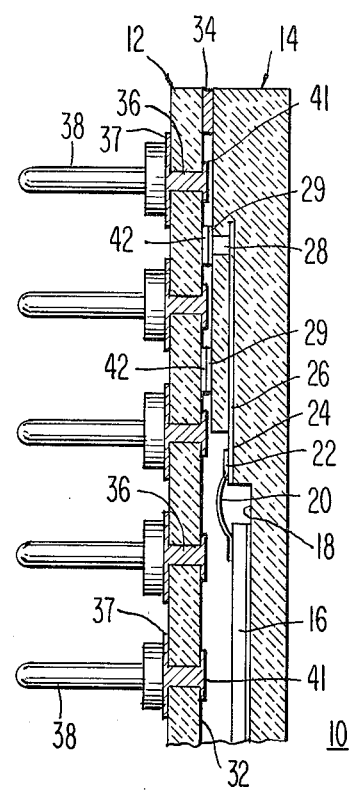
FIG. 2 is a section view of the package taken along lines 2—2 of FIG. 1.
Figure 3:
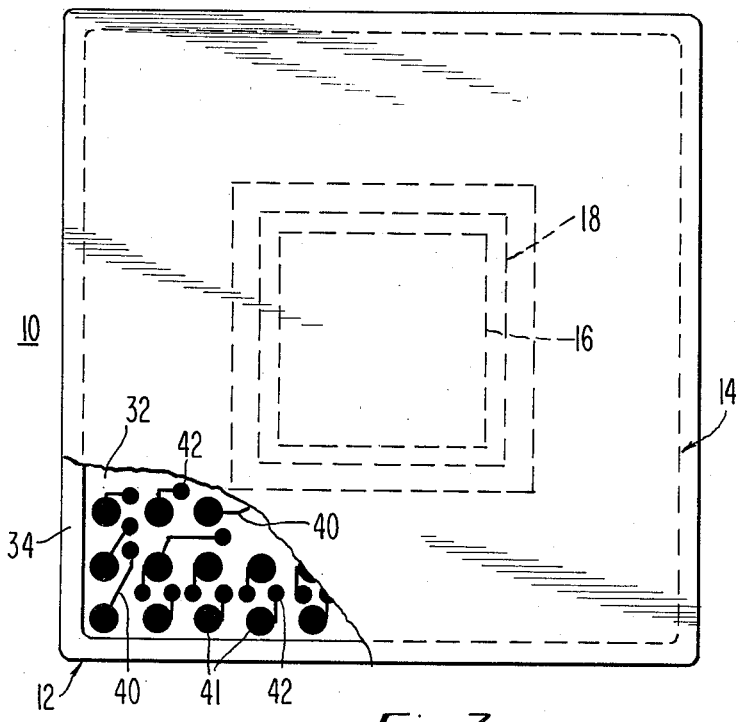
FIG. 3 is a plan view of the package with a portion of the base member cut away.

FIG. 3 is a plan view of the integrated circuit package 10 with a portion of the base member 14 cut away to show the interior surface 32 of the cover member 12. The latter member may be produced by a ceramic process similar to that employed for the base member 14. A plurality of metallized vias 36 (FIG. 2) are formed in the cover member 12 and terminate in bosses 37 on the exterior surface thereof for attaching respectively a plurality of input/output pins 38. Metallized lines 40 are provided on the interior surface 32 of the cover member 12 connecting the lands 41 surrounding vias 36 to electrically conductive pads 42. The pads 42 are homologously disposed with respect to the pads 29 in the base member 14. The shoulders of the input/output pins 38 are brazed to the bosses 37 on the ceramic cover member 12 by a high temperature process. The brazing operation further seals the vias 36 to insure hermeticity.

The final step in the assembly of the integrated circuit package 10, with reference to FIGS. 1 through 3, involves the attachment of the base and cover members to each other, and the connection of the pads 29 in the base member 14 to the pads 42 in the cover member 12. These connections provide electrical continuity and signal paths between the integrated circuit die 16 and the input/output pins 38, and are accomplished by placing high temperature solder on the last mentioned pads. Concurrently, solder is also placed along the metallized seal ring 34 of either the base or cover member or both members. The latter members are then aligned with respect to each other and subjected to sufficient heat to reflow the solder. This operation seals the package and establishes the aforementioned signal paths.

Figure 4:
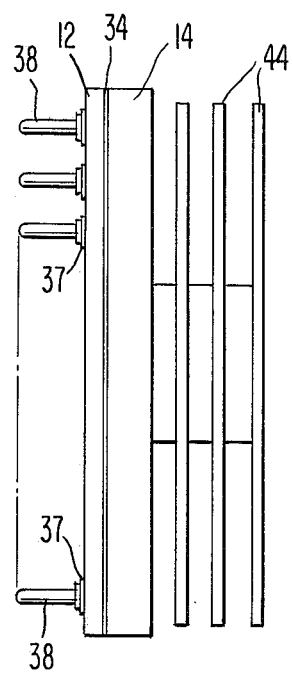
FIG. 4 is a side view of the package depicting optional cooling fins affixed to the base member.

In FIG. 4, the integrated circuit package depicted in FIGS. 1-3 has been modified by the addition of cooling fins 44. The latter, while not required in many applications, offer a convenient method of enhancing the heat dissipation properties of the package. In practice, the fins may be formed as part of the ceramic base member 14. Alternately, they may be of ceramic or metallic material and may be affixed to the outer surface of the cover member such as by soldering, cementing or other well known techniques.

The integrated circuit package described herein is approximately 1 inch square, utilizes 100 input/output pins on 100 mil centers, and accommodates a relatively large die, approximately 0.35 inches square. The overall height of the package from the tips of the input/output pins to the outer surface of the base member is approximately 0.25 inches. It should be understood that the foregoing dimensions are included solely for purposes of example and are not to be considered limitative of the invention. The present package may be produced in various sizes and pin counts depending upon the application.

In conclusion, there has been disclosed an integrated circuit package well suited for present day technology including high speed VLSI and gate array circuits. With the increase in circuit speed, it is essential that interconnection delays be decreased. This can be accomplished by a higher packaging density. The present invention provides a uniform pin field which improves the surface density by a multifold factor compared to existing DIP technology. The dissipation of heat is readily accomplished in a straightforward manner, without costly and complicated structures. It should be apparent that depending upon the particular application, changes and modifications of the package may be required. Such changes and modifications, insofar as they are not departures from the true scope of the invention, are intended to be covered by the following claims.

What is claimed is:

1. An hermetic package for an integrated circuit die which has a plurality of wires emanating from its periphery comprising:

a base member having an outer surface and a mounting surface, said base member having an internal recess for mounting said die in proximity to said outer surface, said base member further including a ledge encompassing said die, a plurality of electrically conductive tabs disposed on the surface of said ledge, said plurality of wires of said die being connected to respective ones of said tabs, a plurality of metallized lines each having an extremity connected respectively to one of said tabs and its remaining portion embedded in the material of said base member, said metallized lines lying in a plane substantially coplanar with the surface of said ledge, said mating surface of said base member lying in a plane parallel to but displaced from that of the surface of said ledge, the area of said last mentioned mating surface being substantially equal to that of said outer surface of said base member less the combined areas of the surface of said internal recess for mounting said die and the surface of said ledge, a plurality of metallized vias connecting the opposite extremities of said metallized lines to respective electrically conductive pads on said last mentioned mating surface, a cover member having an outer surface and a mating surface, said cover member having a plurality of pads on said mating surface, said pads being homologously disposed with respect to said pads on said mating surface of said base member, a plurality of metallized lines on said mating surface of said cover member each having an extremity connected respectively to a pad on said last mentioned surface, a plurality of metallized vias connecting the opposite extremities of said metallized lines to bosses on said outer surface of said cover member, a plurality of input/output terminals affixed respectively to said bosses, said plurality of input/output terminals populating substantially the entire outer surface of said cover member, and means for connecting homologously disposed pads on the mating surfaces of said base and cover members to each other and for sealing said last mentioned surfaces to each other.

2. An integrated circuit package as defined in claim 1 characterized in that said base member and said cover member are formed of thermally conductive material.

3. An integrated circuit package as defined in claim 2 further characterized in that said thermally conductive material is a ceramic.

4. An integrated circuit package as defined in claim 3 wherein said means for connecting homologously disposed pads on the mating surfaces of said base and cover members to each other includes solder deposited on said pads for establishing an electrical connection therebetween during a subsequent solder reflow operation.

5. An integrated circuit package as defined in claim 4 further characterized in that said means for sealing the respective mating surfaces of said base and cover members to each other include a seal ring disposed along the periphery of each of the last mentioned members and solder deposited thereon for subsequent reflow during a solder operation.

6. An integrated circuit package as defined in claim 5 wherein input/output terminals are pins.

7. An integrated circuit package as defined in claim 6 wherein each of said input/output pins includes a shoulder at one extremity thereof, said shoulder being brazed to a boss on the outer surface of said cover member, thereby sealing the via associated therewith.

8. An integrated circuit package as defined in claim 7 further including a plurality of cooling fins affixed to the outer surface of said base member to enhance the dissipation of heat therefrom.

* * * * *